US012764000B2

(12) United States Patent
Zheng et al.

(10) Patent No.: US 12,764,000 B2
(45) Date of Patent: Oct. 13, 2026

(54) TRANSMISSION OF TIME SENSITIVE SIGNAL

(71) Applicant: HEWLETT PACKARD ENTERPRISE DEVELOPMENT LP, Spring, TX (US)

(72) Inventors: Jiguang Zheng, Beijing (CN); Bo Wang, Beijing (CN)

(73) Assignee: Hewlett Packard Enterprise Development LP, Spring, TX (US)

( * ) Notice: Subject to any disclaimer, the term of this patent is extended or adjusted under 35 U.S.C. 154(b) by 55 days.

(21) Appl. No.: 18/783,663

(22) Filed: Jul. 25, 2024

(65) Prior Publication Data

US 2026/0032026 A1 Jan. 29, 2026

(51) Int. Cl.
*H04L 25/49* (2006.01)
*H03K 7/02* (2006.01)

(52) U.S. Cl.
CPC .......... *H04L 25/4912* (2013.01); *H03K 7/02* (2013.01)

(58) Field of Classification Search
CPC .......... H03K 7/02; H03K 9/02; H04B 14/023; H04L 25/4912; H04L 25/4917; H04L 27/02
USPC ................ 375/254, 257, 268, 353; 370/205; 329/312, 313; 332/109, 112
See application file for complete search history.

(56) References Cited

U.S. PATENT DOCUMENTS

2020/0343883 A1* 10/2020 Bonthron ................ H03K 7/02
2021/0176157 A1* 6/2021 Huang .................... H04L 43/50
2023/0327924 A1* 10/2023 Sudhakaran .......... H04L 1/0061
2025/0202526 A1* 6/2025 Wang ................... H04B 1/1615

* cited by examiner

*Primary Examiner* — Young T. Tse
(74) *Attorney, Agent, or Firm* — Hewlett Packard Enterprise Patent Department

(57) ABSTRACT

Implementations of the present disclosure relate to a system comprising an access point (AP) and a USB device operating at the same frequency as the AP. The USB device may modulate a plurality of time-sensitive signals into a current pulse amplitude modulation (PAM) signal, and a plurality of different amplitudes in the current PAM signal is associated with occurrence of high level of a plurality of different combinations of time-sensitive signals in the plurality of time-sensitive signals. That is to say, when high level occurs in different numbers of time-sensitive signals, the modulated current PAM signal will have different power levels. Accordingly, the AP comprises a decoder for demodulating the current PAM signal to obtain a digital signal representing one or more time-sensitive signals transmitted from the USB device to the AP, thereby enabling the transmission of multiple time-sensitive signals from the USB device to the AP.

18 Claims, 6 Drawing Sheets

TRANSMISSION OF TIME SENSITIVE SIGNAL

BACKGROUND

Recently, more and more different types of communication devices, for example, Wi-Fi devices, Blue-tooth devices, fourth-generation (4G) communicating devices, and fifth-generation (5G) communication devices, are located in a same place, for example, located in a same room. A Universal Serial Bus (USB) device (for example, a USB dongle device) is plugged into an access point (AP) as an accessory of the AP, such as Bluetooth dongle devices, Zigbee dongle devices, carrier dongle devices, scanning dongle devices, etc. The AP and the USB device are co-located communication devices and may be designed to operate at a same frequency, and thus may interfere with each other. With the development of communication technology, these different types of communication devices may also be designed to support a time-sensitive network (TSN). As such, a plurality of time-sensitive signals (TSS) is required to be transmitted between these devices having the same operation frequency band such that these devices may operate according to the TSSs and meet the time requirement of related TSN protocols. In some scenarios, two or more TSSs (such as pulse-per-second signals and channel coexistence signals) need to be transmitted simultaneously from the USB device to the AP.

BRIEF DESCRIPTION OF THE DRAWINGS

Implementations of the present disclosure may be understood from the following Detailed Description when read with the accompanying figures. In accordance with the standard practice in the industry, various features are not drawn to scale. In fact, the dimensions of the various features may be arbitrarily increased or reduced for clarity of discussion. Some examples of the present disclosure are described with reference to the following figures.

DETAILED DESCRIPTION

Figure 1A:
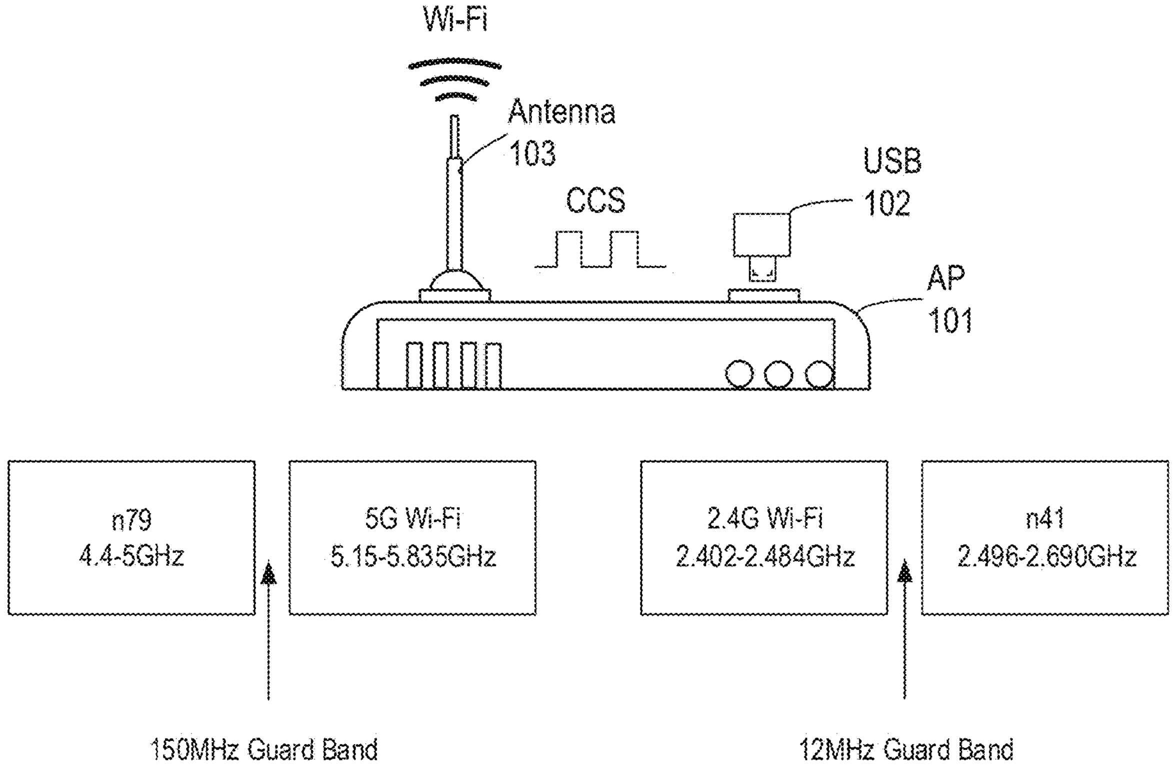
FIG. 1A illustrates a schematic diagram of a scenario of transmitting a channel coexistence signal (CCS) between an AP and a USB device according to some implementations of the present disclosure.

A time-sensitive network (TSN) is a network protocol used to connect industrial equipment to ensure time synchronization and real-time performance for efficient and accurate control and monitoring in manufacturing, energy, transportation, and the like. TSN optimizes network transmission and processing mechanisms to ensure that-sensitive data (such as video, audio, and sensor data) may be transmitted quickly, in real-time, and accurately across the network. It employs a range of technologies to achieve this, including time synchronization, flow control, priority scheduling, and the like. Wireless APs may support the TSN protocol for transmitting time-sensitive data in wireless environments.

In some scenarios, different types of communication devices, for example, Wi-Fi devices, Blue-tooth devices, 4G communicating devices, and 5G communication devices, are located in the same place. For example, USB dongle devices are typically plugged into a USB interface on the AP for some extended functionality. The USB dongle device may be extended as a Bluetooth device, a WI-FI device, or even a micro-transmitter base station, for example, a 4G or 5G base station. The Bluetooth devices typically operate at the 2.4 GHz. The WI-FI devices may operate at the 2.4 GHz, 5 GHZ, or 6 GHz. For example, the USB dongle device may be used as a USB-adapted RF scanner or a USB-adapted ultra-bandwidth device. In this case, the USB dongle device acts as a slave device, and the AP acts as a master device. The maximum current from the AP is, for example, 500 mA, and the voltage range supplied by the AP is, for example, 4.7 V to 5 V.

In some scenarios, the TSS is used as a control signal for USB dongle devices, and the transmission power-on ramp measurement verifies that the transmission power reaches 90% of the maximum power within a 2-microsecond envelope according to IEEE 802.11 standard. Transmission power-off ramp measurement verifies that the transmitted power drops to 10% of maximum power within a 2-microsecond envelope according to IEEE 802.11 standard. According to the protocol standard, the transmission power-on ramp is required to be not greater than 2 microseconds, and the transmission power-off ramp is also required to be not greater than 2 microseconds. This ensures that the burst power is turned on/off at the proper rate. For LTE, according to the 3GPP TS36.104 standards, the time of the rising and falling edges should not be greater than 17 microseconds. In time division duplex mode, fast rise and fall times are required, so the control signal of the USB dongle device is time-sensitive, which can ensure the fast transmission and reception of data at the USB dongle device. In some cases, it is necessary to transmit two or more TSSs from a USB device to an AP with time delay complying the standards and faster response, but there is currently no technology that can achieve this goal.

In view of the foregoing, the implementations of the present disclosure provide a system for transmitting a plurality of time-sensitive signals between an AP and a USB device, specifically from the USB device to the AP. The USB device operates at the same frequency as the AP. The USB device may modulate a plurality of time-sensitive signals into a current pulse amplitude modulation (PAM) signal, and a plurality of different amplitudes in the current PAM signal is associated with the occurrence of high level of a plurality of different combinations of time-sensitive signals in the plurality of time-sensitive signals. That is to say, when high level occurs in different numbers of time-sensitive signals, the modulated current PAM signal will have different power levels. Accordingly, the AP comprises a decoder for demodulating the current PAM signal to obtain a digital signal representing one or more time-sensitive signals transmitted from the USB device to the AP. By modulating multiple time-sensitive signals into a same current PAM signal on the USB device and providing a decoder on the AP to demodulate the current PAM signal, multiple time-sensitive signals may be demodulated, thereby enabling the transmission of multiple time-sensitive signals from the USB device to the AP.

The advantages of implementations of the present disclosure will be described with reference to example implementations as described below. Reference is made below to FIG. 1A through FIG. 6 to illustrate basic principles and several example implementations of the present disclosure herein.

Reference is made to FIG. 1A, which illustrates a schematic diagram of a scenario of transmitting a channel coexistence signal CCS between a wireless AP and a USB device (for example, a USB dongle device) according to some implementations of the present disclosure. As shown in FIG. 1A, the system includes an AP 101 and a USB device 102, which may be directly inserted into a USB interface on the AP. The USB device 102 may be any type of device, for example, the USB dongle device may be extended as a Bluetooth device, a WI-FI device, or even a micro-transmitter base station, for example, a 4G or 5G base station. In some implementations, the USB device 102 may be a USB radio frequency scanner or a USB ultra-wideband device. The USB device 102 uses the same operating frequency as the AP 101. For example, when the USB device 102 operates at a 5G frequency, the n79 channel has a frequency band of 4.4 GHz to 5 GHz and a 150 MHz Guard band, which conflicts with the 5.15 to 5.835 GHz frequency band of the 5G Wi-Fi of the AP 101. When the USB device 102 operates at a 2.4G frequency of LTE, the n41 channel has a frequency band of 2.496 GHz to 2.690 GHz and a 12 MHz Guard band, which conflicts with the 2.402 GHz to 2.484 GHz frequency band of 2.4G Wi-Fi of the AP 101.

The latest 3GPP standard limits the transmission power of the module to a maximum of 31 dBm (class1)/chain. When the USB device 102 is about to send data, a filter of the AP 101 cannot provide sufficient suppression because the USB device 102 is very close to the antenna 103 of the AP 101 and the signal channels between the USB device 102 and the AP 101 them overlap, for example, both n41 and n79 are very close to the frequency of AP Wi-Fi. In this scenario, the USB device 102 needs to send a CCS to the AP 101 to inform the AP 101 that there is an overlap between their channels. According to the CCS signal, the AP 101 can set a low-noise amplifier (not shown) in protection mode to prevent the signal sent by the USB device 102 from being transmitted to the AP 101, otherwise, the large amount of data will cause data congestion in the AP 101. Therefore, there is a need for propagating the real-time CCS from the USB device 102 to the AP 101 timely.

Figure 1B:
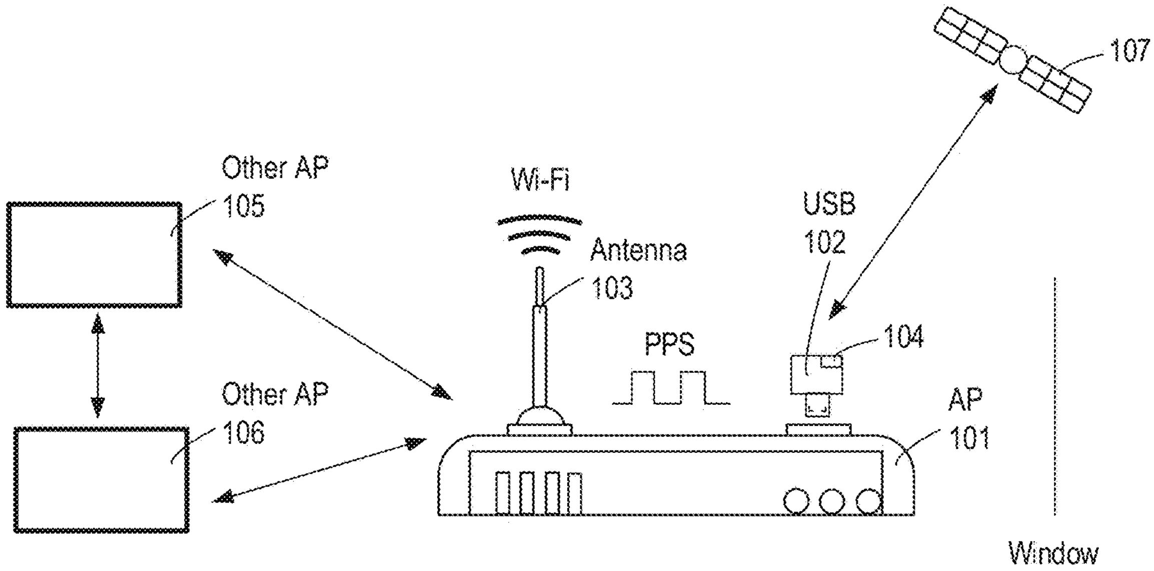
FIG. 1B illustrates a schematic diagram of a scenario of transmitting a pulse per second (PPS) between an AP and a USB device according to some implementations of the present disclosure.

Reference is made to FIG. 1B, which illustrates a schematic diagram of a scenario of transmitting pulses per second (PPS) between an AP 101 and a USB device 102 according to some implementations of the present disclosure. The application of 5G and Wi-Fi 7 is driving the evolution of TSN networks from wired networks to wireless networks. Currently, GNSS receivers have been deployed in Wi-Fi 6E products for positioning. As shown in FIG. 1B, a Global Navigation Satellite System (GNSS) receiver 104 may be provided on the USB device 102 and placed near a window of a building and configured to receive GNSS signal from a satellite 107, so that time synchronization or reference time with microsecond (i.e., nanometer) accuracy may be provided between the AP 101 to which the USB device is connected and nearby Wi-Fi products (for example, other APs 105 and 106). Therefore, there is a need to propagate the PPS from the USB device 102 to the AP 101 timely.

The USB 2.0 interface on an AP 101 usually includes type A and type B, and both of them comprise four pins, namely the power pin V+, the ground pin GND, and the two data pins D+ and D− for transmitting data. Similarly, USB device 102 (for example, USB dongle device) includes the same type of USB interface. Traditionally, data pins D+ and D− are used to transfer data between AP 101 and USB dongle device 102. The data pins D+ and D− of the USB interface on the AP 101 require the signal representing the serial data to be modulated using a specific protocol. Then, the corresponding data pins D+ and D− of the interface on the USB device 102 also need to demodulate the signal using that specific protocol. When using a specific protocol to modulate and demodulate a signal, extracting the TSS from the serial data transmitted by data pins D+ and D− requires operations at the MAC layer or even higher. Thus, the latency of the transmission of TSS is uncertain or not fixed, and even quite high. In addition, the time of serial-to-parallel conversion is also uncertain. Therefore, the serial data path comprising data pins D+ and D− is not suitable for transmitting TSS.

Then, in order to transmit TSS between the AP 101 and the USB device 102, the power supply pin and reception pin may be considered, which does not involve the specific protocol requiring media access control (MAC) layer or higher layers (e.g., network layer, transport layer, or application layer, etc.), but is only at the lowest physical layer (e.g., via the power pin). Therefore, the transmission via the power pins is not restricted by a specific protocol and does not introduce time delays caused by the MAC layer or even higher layers (e.g., software) in the process, so it is possible to consider using the power pin to transmit TSS. The power pins may be used to transmit one type of TSS one time, and if there are a first number of TSSs (for example, more than two TSSs) to be transmitted between the AP the USB device, the power pins of the USB 2.0 interface may be not adequate for transmitting two or more TSSs simultaneously.

Figure 2:
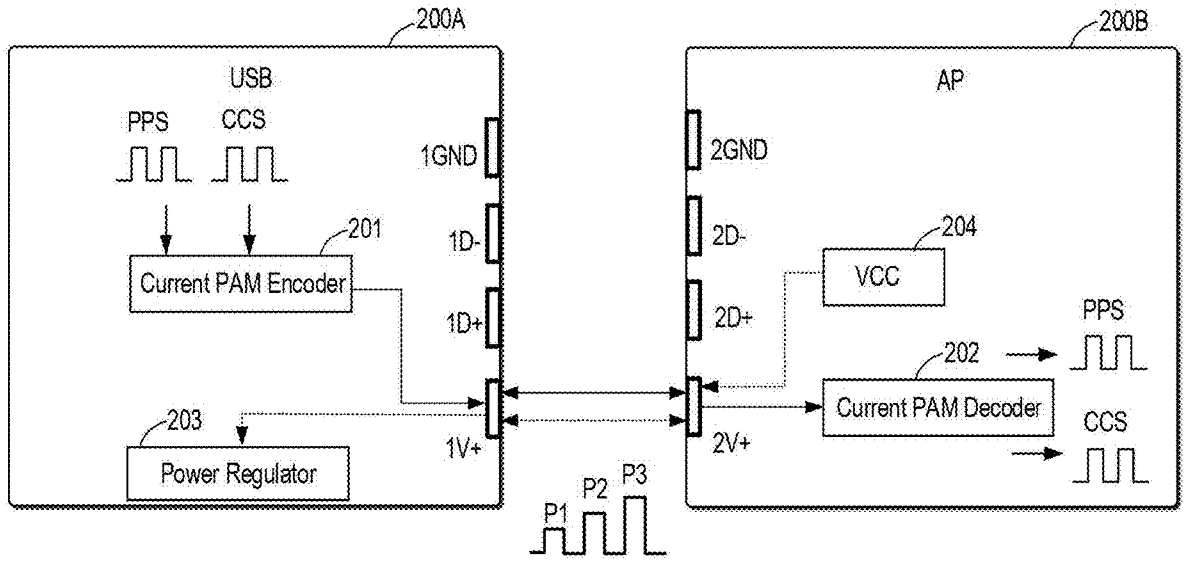
FIG. 2 illustrates a schematic diagram of a circuitry for simultaneously transmitting two or more TSSs from a USB device to an AP according to some implementations of the present disclosure.

Reference is made to FIG. 2, which shows a schematic diagram of a circuit system for simultaneously transmitting two or more time-sensitive signals from a USB device to an AP according to some implementations of the present disclosure. As shown in FIG. 2, the USB device 200A may correspond to the USB device 102 of FIG. 1; the AP 200B may correspond to the AP 101 of FIG. 1.

As shown in FIG. 2, the USB interface on the USB device 200A includes four pins, namely 1GND, 1D+, 1D−, and 1V+. The USB interface on the AP 200B also includes four pins, namely 2GND, 2D+, 2D−, and 2V+. A current pulse amplitude modulation (PAM) encoder 201 is provided on the USB device 200A, which is used to modulate multiple time-sensitive signals (e.g., PPS and CCS) into a current PAM signal, wherein multiple different amplitudes in the current PAM signal are associated with the occurrence of high levels of multiple different combinations of time-sensitive signals in the multiple time-sensitive signals. For example, in some implementations, the plurality of TSSs includes two different TSSs, and the modulated current PAM signal includes three current peaks. In some implementations, the first TSS of the two different TSSs is the CCS, and the second TSS of the two different TTSs is the PPS.

For example, as shown in FIG. 2, the TSS signal is a sawtooth wave signal including alternating high and low levels. The peak value P1 of the current PAM signal is associated with the occurrence of a high level in the first TSS of the two time-sensitive signals. The peak value P2 of the current PAM signal is associated with the occurrence of a high level in the second TSS of the two time-sensitive signals. The peak value P3 of the current PAM signal is related to the occurrence of high level of both time-sensitive signals. For example, the peak value P1 is related to the occurrence of the high level of CCS, the peak value P2 is related to the occurrence of the high level of PPS, and the peak value P3 is related to the occurrence of the high level of CCS and PPS at the same time.

Although FIG. 2 shows only the transmission of PPS and CCS signals between the AP and the USB device, those skilled in the art should understand that the time-sensitive signal may be other types of time-sensitive signals, and the number of time-sensitive signals may be more than two, and the present disclosure is not limited to the type and number of time-sensitive signals described in FIG. 2. For example, in some implementations (not shown), in the case that there are 3 time-sensitive signals, there are 7 peaks in the current PAM signal. Therefore, the number of peaks in the current PAM signal is related to the number of time-sensitive signals transmitted.

As shown in FIG. 2, the modulated current PAM signal is transmitted to the pin 2V+ of the AP via the pin 1V+ of the USB device 200A, as denoted by the solid line. It should be understood that there is also a voltage supply line as denoted by the dotted line, as shown in FIG. 2, a power supply 204 is provided on the AP 200B, and the power may be supplied to the USB device 200A through the power supply pin 2V+ and the power receiving pin 1V+. As shown in FIG. 2, the USB device 200A is provided with a voltage regulator 203, which may be connected to the power receiving pin 1V+, so as to receive the power for the power supply 204 and regulate, for example, a 5V voltage from the AP 200B, for example, to a 3.3V voltage, so as to power various components on the USB device, and this is in the voltage supply line as denoted by the dotted line.

As shown in FIG. 2, a current PAM decoder 202 is provided on the AP 200B, which is used to demodulate the modulated current PAM signal to obtain a digital signal representing one or more time-sensitive signals transmitted from the USB device to the AP, so that multiple types of time-sensitive signals may be transmitted from the USB device to the AP. For example, different digital signals may be used to represent the type and number of TSS signals transmitted to the AP. Through the decoding of the current PAM decoder 202, a digital signal may be obtained to represent the type and number of TSS signals delivered to the AP. For example, the following Table 1 illustrates digital representations output by the current PAM decoder 202 of the AP when transmitting the two signals CCS and PPS may be represented, and the table may be presented in the form of a lookup table.

TABLE 1 digital signal in the lookup table and the type of transmitted TSS

| Type of transmitted TSS | Output of the current PAM decoder |
|---|---|
| Normal or power OFF | 000 |
| Only CCS | 100 |
| Only PPS | 110 |
| PPS + CCS | 111 |

As shown in the above table, different digital signals correspond to different time-sensitive signals being transmitted to the AP, so the type and number of time-sensitive signals delivered to the AP may be indicated to the controller of the AP through the digital signal output from the current PAM decoder. The current PAM decoder 202 may be implemented in various forms, such as hardware or an artificial intelligence learning model, as long as the decoder 202 can obtain the current consumption of the USB device 200A and determine which TSS signal is or which TSS signals are at a high level based on the current consumption.

In the system of the present disclosure, the USB device 200A may modulate a plurality of time-sensitive signals into a same current PAM signal by a current PAM encoder 201, and a plurality of different amplitudes in the current PAM signal are associated with occurrence of high level of a plurality of different combinations of time-sensitive signals in the plurality of time-sensitive signals. That is to say, when high level occurs in different numbers of time-sensitive signals, the modulated current PAM signal will have different power levels. Accordingly, the AP 200B comprises a decoder 202 for demodulating the current PAM signal to obtain a digital signal representing one or more time-sensitive signals transmitted from the USB device to the AP. By modulating multiple time-sensitive signals into a same current PAM signal by an encoder on the USB device and providing a decoder on the AP to demodulate the current PAM signal, multiple time-sensitive signals transmitted from the USB device to the AP may be demodulated to be for example, digital signals, thereby enabling simultaneous transmission of multiple time-sensitive signals from the USB device to the AP, and the type and number of transmitted TSSs may be represented by a digital output from the decoder.

Further, the modulated current PAM signal is transmitted from the USB device to the AP through the above-mentioned pins 1V+ and 2V+. Since the power pins, the current PAM encoder 201 and the current PAM decoder 202 are all physical components, and they are all at the lowest physical layer, and do not involve data transmission with the media access control (MAC) layer or higher layers (e.g., network layer, transport layer, or application layer, etc.). Therefore, the transmission of a plurality of time sensitive signals from the USB device 200A to the AP 200B is not restricted by any specific protocol, and no time delay caused by the MAC layer or even higher layers (e.g., software) is introduced in the process.

Figure 3:
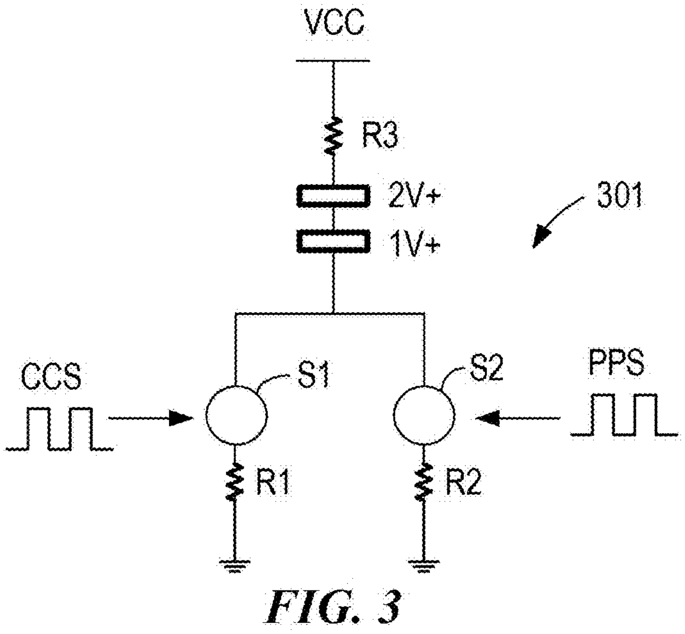
FIG. 3 illustrates a schematic diagram of a current pulse amplitude modulation (PAM) encoder in a USB device according to some implementations of the present disclosure.

Reference is made to FIG. 3, which illustrates a schematic diagram of a current PAM encoder in a USB device according to some implementations of the present disclosure. The current PAM encoder 301 corresponds to the current PAM encoder 201 of FIG. 2, and the VCC corresponds to the power supply 204 of FIG. 2. The PAM encoder 301 according to the present disclosure includes a plurality of branches (for example, a first number of branches). Each of the branch is connected between a power supply VCC and a ground potential, and the number of the plurality of branches corresponds to the number of TSSs to be transmitted. Each TSS controls each branch, so that when a high level appears in the corresponding TSS, each branch is electrically conductive, so that a certain current may flow through the branch. The currents flowing through the plurality of branches are different, so that different peak values may appear in the formed current PAM signal.

As shown in FIG. 3, the current PAM encoder 301 includes a power supply VCC, switches S1 and S2, and grounded dummy resistors R1 and R2, wherein the dummy load is a resistive load that consumes a fixed current. The power supply VCC is a voltage supply source (e.g., a 5V regulated power source) located on, for example, the AP, and the power supply VCC is connected to switches S1 and S2 through a power path of a power pin 2V+ of the AP and a power pin 1V+ on the USB device. The switch S1 is connected in series between the dummy resistor R1 and the power supply VCC to form a first branch, and when the switch S1 is turned on, there is a potential difference between the power supply VCC and the ground point, so the current flows through the dummy load, for example, resistor R1. The switch S2 is connected in series between the dummy load, for example, resistor R2 and the power supply VCC to form a second branch, and when the switch S2 is turned on, there is a potential difference between the power supply VCC and the ground point, so the current flows through the dummy load, for example, resistor R2. The CCS is used to control the switch S1, and the PPS is used to control the switch S2. In normal operation, no PPS or CCS is switched to a high level, so both switches S1 and S2 remain switched off, so no current flows through the resistors R1 and R2. When the CCS appears at a high level, the switch S1 is turned on, so that the current flows through the resistor R1. When PPS appears at a high level, the switch S2 is turned on, so that the current flows through the resistor R2. Metal oxide field effect transistor MOSFET may be used for the switch. FIG. 3 also shows a sampling resistor R3 located on the AP side, which is connected between the power supply VCC and the power pin 2V+ of the AP. The sampling resistor R3 will be described in detail later.

Therefore, the current PAM encoder 301 includes multiple dummy resistors, such as resistors R1 and R2, so that the amplitude of the dark current flowing through the resistors R1 and R2 changes, so that different current values may appear. When current flows through the resistor R1 or the resistor R2, the current in the power supply VCC will change significantly. As described above, when current flows through at least one of the resistors R1 or R2, the current in the transmission path of the power supply voltage will change significantly, and the current PAM decoder 202 at the host end, i.e., the AP end, will detect this significant change in current in the power supply.

Figure 4:
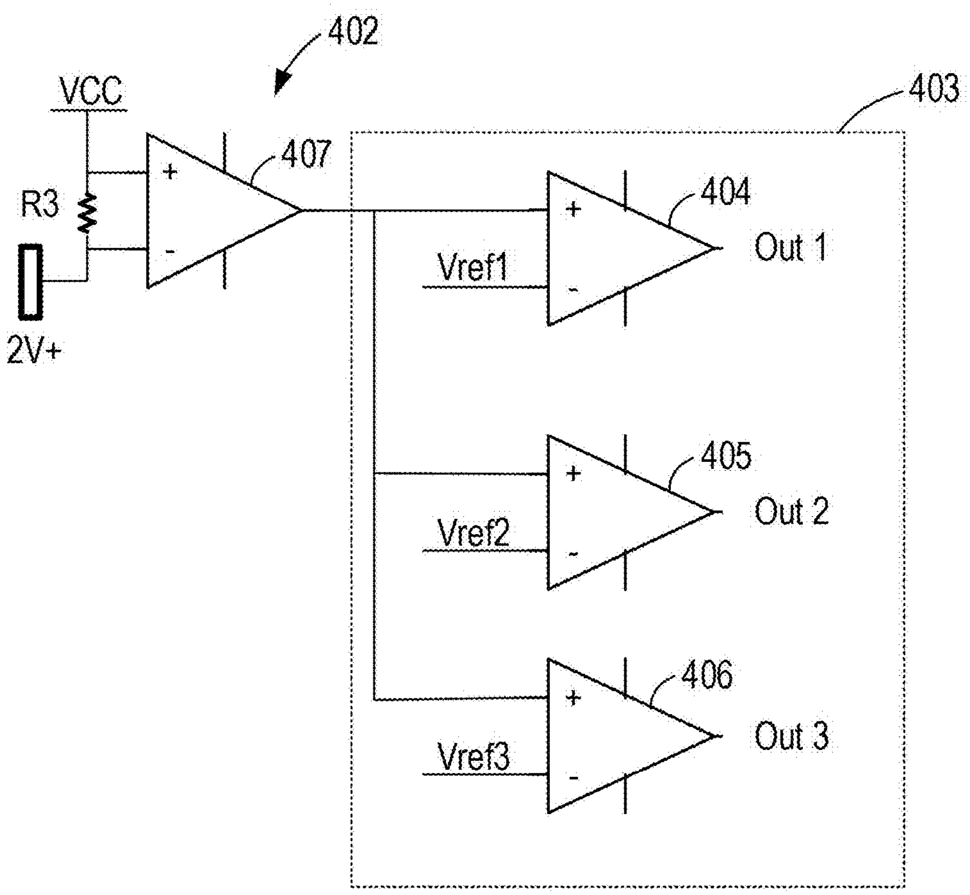
FIG. 4 illustrates a schematic diagram of a current PAM decoder in an AP according to some implementations of the present disclosure.

Reference is made to FIG. 4, which illustrates a schematic diagram of a current PAM decoder in an AP according to some implementations of the present disclosure. The current PAM decoder 402 corresponds to the current PAM decoder 202 of FIG. 2, and the VCC corresponds to the power supply 204 of FIG. 2.

The PAM decoder 402 includes the sampling resistor R3 as described above, and the resistor R3 is connected in series between the power supply VCC and the power pin 2V+ of the AP. When current flows through the resistor R1 or the resistor R2, the current will also flow through the sampling resistor R3. Then, since the power pin 2V+ of the AP is connected to the power pin 1V+ of the USB device, the current mutation from the USB device may be collected by the sampling resistor R3.

Under normal conditions (PPS and CCS do not exist, or are both low levels) (for example, the current consumption on the USB device under normal conditions is between 150 mA and 200 mA). When CCS appears at a high level, the switch S1 is turned on, so that the first mutation current (for example, 100 mA) flows through the resistor R1, and correspondingly, the mutation current also flows through the sampling resistor R3. Therefore, when CCS appears at a high level, the current flowing through the sampling resistor R3 may be in the range of 250 mA to 300 mA. When PPS is at a high level, switch S2 is turned on, so that the second mutation current (for example, 200 mA) flows through resistor R2, and the mutation current also flows through sampling resistor R3. Then, when PPS is at a high level, the current flowing through sampling resistor R3 may be in the range of 350 mA to 400 mA. When both CCS and PPS are at high levels, switches S1 and S2 are turned on, so that the first and second mutation currents flow through resistors R1 and R2 respectively, and the total mutation current (for example, 300 mA) flows through sampling resistor R3 accordingly). Then, when both CCS and PPS are at high levels, the current flowing through sampling resistor R3 may be in the range of 450 mA to 500 mA.

As shown in FIG. 4, the current PAM decoder 402 further includes an amplifier 407. The voltage across the sampling resistor R3 varies from one current flowing through the sampling resistor R3 to another current flowing through the sampling resistor R3. The relatively low voltages across the resistor R3 may be detected and amplified by the amplifier 407 to be a relatively high voltage that can be detected by other electronic devices.

As shown in FIG. 4, the current PAM decoder 402 further comprises a determination module 403 configured to determine the type and number of the time-sensitive signals at high level among the first number of time-sensitive signals based on the sampling voltage, for example, the amplified voltage from the amplifier 407. As shown in FIG. 4, the determination module 403 includes three comparators, for example, a comparator 404, a comparator 405, and a comparator 406, which respectively have different reference voltages, namely Vref1, Vref2, and Vref3, and thus have different outputs, namely output 1, output 2, and output 3. The amplified voltage is input to one input terminal of each comparator and is respectively compared with Vref1, Vref2, and Vref3. The reason for using comparators instead of an ADC (analog-to-digital converter) is to obtain a faster response and reduce delay.

When selecting Vref1, Vref2, and Vref3, it is necessary to consider the maximum and minimum values between the functional power losses (i.e., the normal current consumption of the USB device under the normal conditions described above when there is no TSS signal or the TSS signals are all low), the power loss of the dummy load corresponding to the high level of PPS, and the power loss of the dummy load corresponding to the high level of CCS.

Figure 5A:
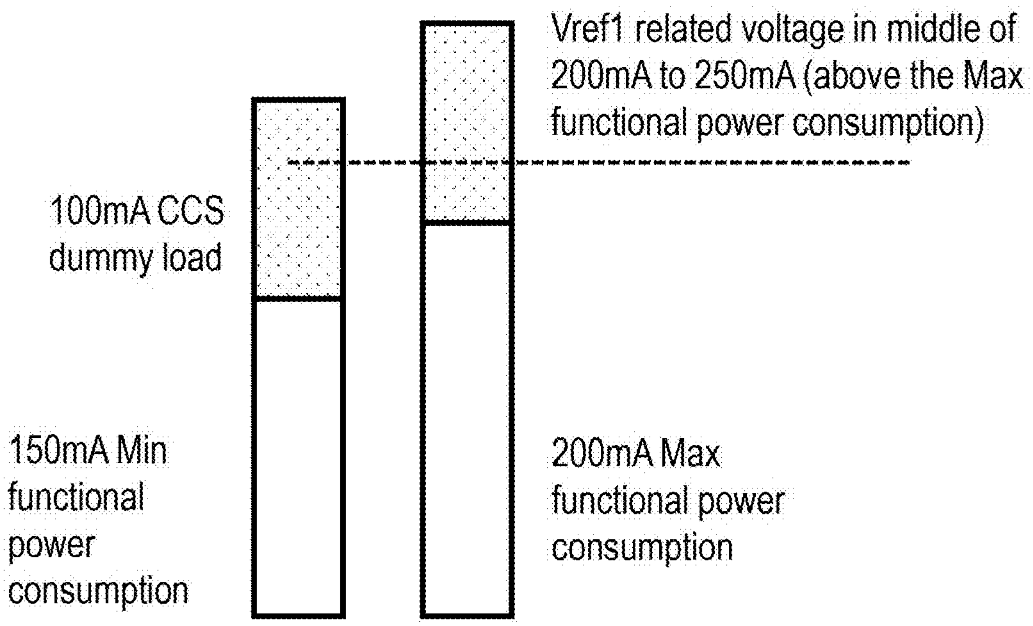
FIG. 5A illustrates a schematic diagram of a value range of a first reference voltage according to some implementations of the present disclosure.

Hereinafter, the selection of the Vref1, Vref2, and Vref3 will be described with reference to FIGS. 5A to 5C. FIG. 5A is a schematic diagram showing the value range of Vref1 according to some implementations of the present disclosure, FIG. 5B is a schematic diagram showing the value range of Vref2 according to some implementations of the present disclosure; and FIG. 5C is a schematic diagram showing the value range of Vref3 according to some implementations of the present disclosure.

As described above, for example, the normal current consumption of the USB device may be in the range of (150 mA, 200 mA); when CCS is at a high level, the current flowing through the sampling resistor R3 may be in the range of (250 mA, 300 mA); when PPS is at a high level, the current flowing through the sampling resistor R3 may be in the range of (350 mA, 400 mA); when both CCS and PPS are at a high level, the current flowing through the sampling resistor R3 may be in the range of (450 mA, 500 mA).

Figure 5B:
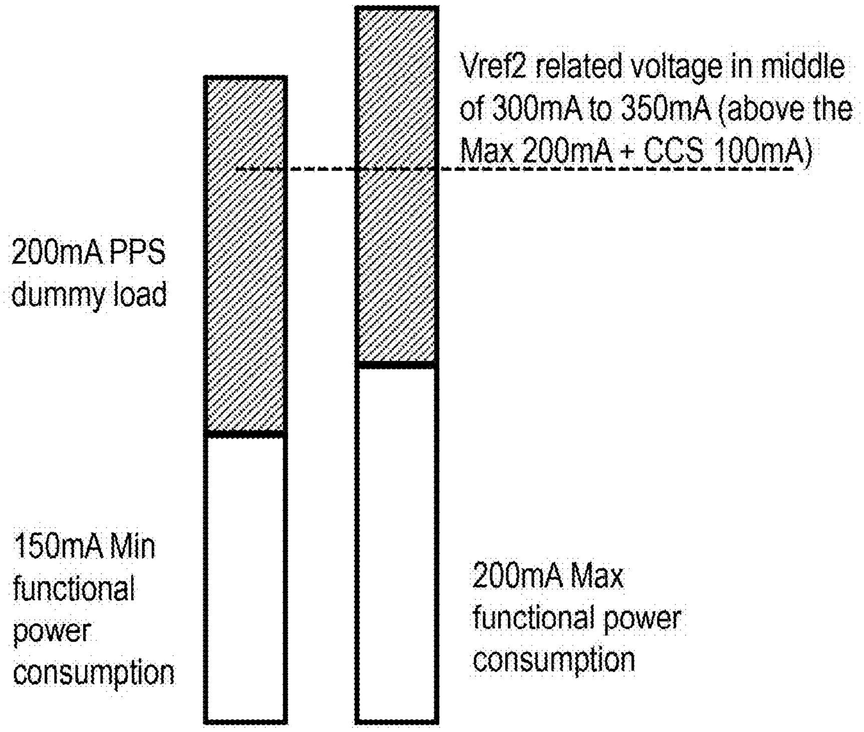
FIG. 5B illustrates a schematic diagram of a value range of a second reference voltage according to some implementations of the present disclosure.
Figure 5C:
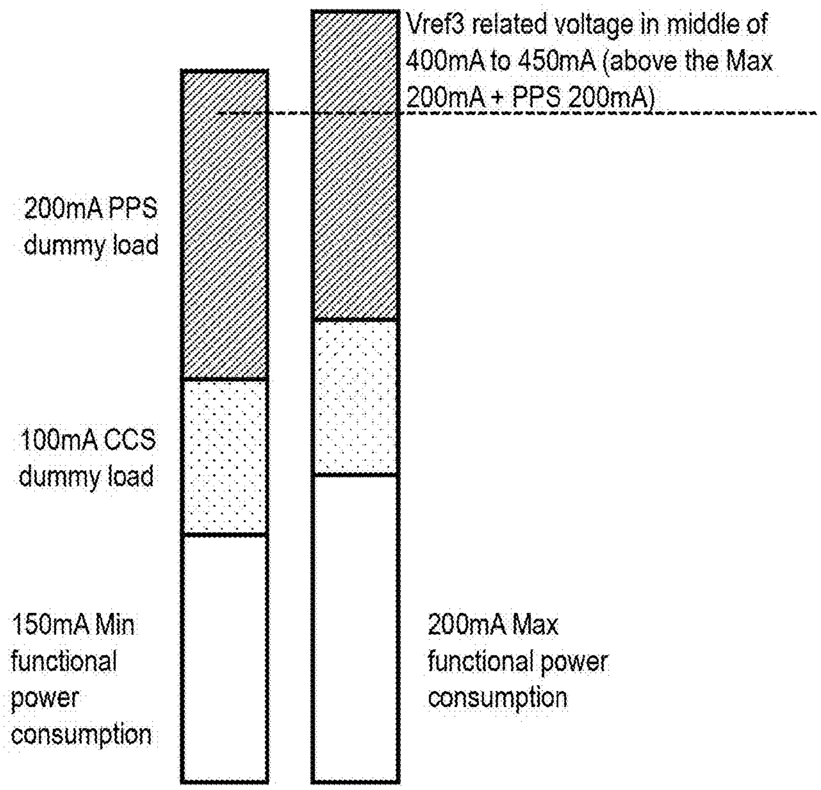
FIG. 5C illustrates a schematic diagram of a value range of a third reference voltage according to some implementations of the present disclosure.

As shown in FIG. 5A, FIG. 5B, and FIG. 5C, the value range of Vref1 needs to be greater than the maximum normal current consumption of 200 mA and less than the minimum current of 250 mA on the sampling resistor R3 when CCS appears high level, so the value range of Vref1 is between (200 mA, 250 mA). The value range of Vref2 needs to be greater than the maximum current consumption of 300 mA when CCS appears high level and less than the minimum current of 350 mA on the sampling resistor R3 when PPS appears high level, so the value range of Vref2 is between (300 mA, 350 mA). The value range of Vref3 needs to be greater than the maximum current consumption of 400 mA when PPS appears high level and less than the minimum current of 450 mA on the sampling resistor R3 when both PPS and CCS appear high level, so the value range of Vref3 is between (400 mA, 450 mA).

When both CCS and PPS are low, the current flowing through the sampling resistor R3 is within the range of (150 mA, 200 mA), which is less than the minimum value of Vref1, so the outputs 1, 2, and 3 are all low (i.e., digital 0). When CCS is high, the current flowing through the sampling resistor R3 will be equal to or greater than Vref1, but less than Vref2 and Vref3, so output 1 is high (i.e., digital 1), while output 2 and output 3 are low (i.e., digital 0). When PPS is high, the current flowing through the sampling resistor R3 will be equal to or greater than Vref1 and Vref2, but less than Vref3, so output 1 and output 2 are high (i.e., digital 1), and output 3 is low (i.e., digital 0). When both PPS and CCS are high, the current flowing through the sampling resistor R3 will be equal to or greater than Vref1, Vref2, and Vref3, so output 1, output 2, and output 3 are all high (i.e., digital 1).

Therefore, the correspondence between output 1, output 2, and output 3 and the transmitted time-sensitive signal is shown in Table 2 below.

TABLE 2 type of transmitted TSSs and the digital signal of the three outputs

| Type of transmitted TSS | Output 1 | Output 2 | Output 3 |
|---|---|---|---|
| Normal or power OFF | 0 | 0 | 0 |
| Only CCS | 1 | 0 | 0 |
| Only PPS | 1 | 1 | 0 |
| PPS + CCS | 1 | 1 | 1 |

The Table 2 may be in the form of a lookup table, using the digital signal formed by the comparator and the lookup table instead of (analog-to-digital converter), which can obtain faster response and reduce delay.

It should be noted that FIG. 5 only shows the selection of three reference voltages when two time-sensitive signals are transmitted simultaneously. If more than two time-sensitive signals need to be transmitted simultaneously, a different number of reference voltages needs to be set.

Although in the above-mentioned implementations, sampling resistors, amplifiers, and comparators are used to form the current PAM decoder 402, and the three comparators are used to form the determination module, other forms can also be used to form the current PAM decoder 402. For example, an artificial intelligence model may be formed as the determination module 403, and related sensors may be used as the sampling resistors monitor the current consumption on the USB device. Through long-term monitoring, it is possible to learn the current consumption on the USB device when both PPS and CCS are low or these two time-sensitive signals do not exist, for example, the current consumption is generally in the range of (150 mA, 200 mA). In addition, the model can also learn that when CCS is high, the current flowing through the sampling resistor R3 may be in the range of (250 mA, 300 mA); when PPS is high, the current flowing through the sampling resistor R3 may be in the range of (350 mA, 400 mA); and when both CCS and PPS are high, the current flowing through the sampling resistor R3 may be in the range of (450 mA, 500 mA). By learning the above current consumption, when the current sensed by the sensor is input into the artificial intelligence model, the artificial intelligence model can make a judgment directly without providing multiple comparators on the AP.

By using an artificial intelligence model to monitor the current consumed by the USB device when transmitting different types of TSS at the same time, the artificial intelligence model learns the correspondence between the type and quantity of TSS transmitted and the current consumption on the USB device. After learning this correspondence, after receiving input about sensed consumption current from the current sensor, the artificial intelligence model may timely determine the type and quantity of the transmitted current, etc., without considering the use of multiple comparators and setting a variety of appropriate reference voltages, making the product more convenient and intelligent.

It should be noted that FIG. 5 only shows the selection of three reference voltages when two time-sensitive signals are transmitted simultaneously. If more than two time-sensitive signals need to be transmitted simultaneously, a different number of reference voltages needs to be set.

Figure 6:
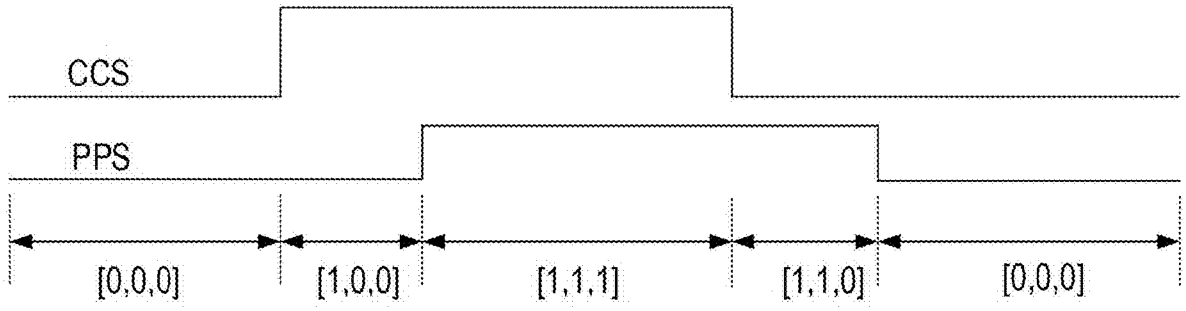
FIG. 6 illustrates a schematic diagram of a correspondence between two physical TSSs and a digital signal in a lookup table according to some implementations of the present disclosure.

FIG. 6 shows a schematic diagram of the correspondence between two physical time-sensitive signals and the digital signal in the lookup table according to some implementations of the present disclosure. As shown in FIG. 6, when CCS and PPS are both low, the output values of output 1, output 2, and output 3 in the lookup table are 000; when CCS is high and PPS is low, the output value is 100; when CCS and PPS are both high, the output value is 111; when CCS is low and PPS is high, the output value is 110.

Therefore, by sampling the current consumption on the USB device through the sampling resistor R3 shown in FIG. 4 and inputting the sampled voltage corresponding to the current into the comparators 404, 405, and 406, the states of the CCS and PPS signals may be represented in the form of digital signals. The digital signal may be used to determine which TSS is transmitted to the AP. The decoder on the AP is used to demodulate the current PAM signal into a digital number in the lookup table, multiple time-sensitive signals may be demodulated, thereby enabling the transmission of multiple time-sensitive signals from the USB device to the AP.

Figure 7:
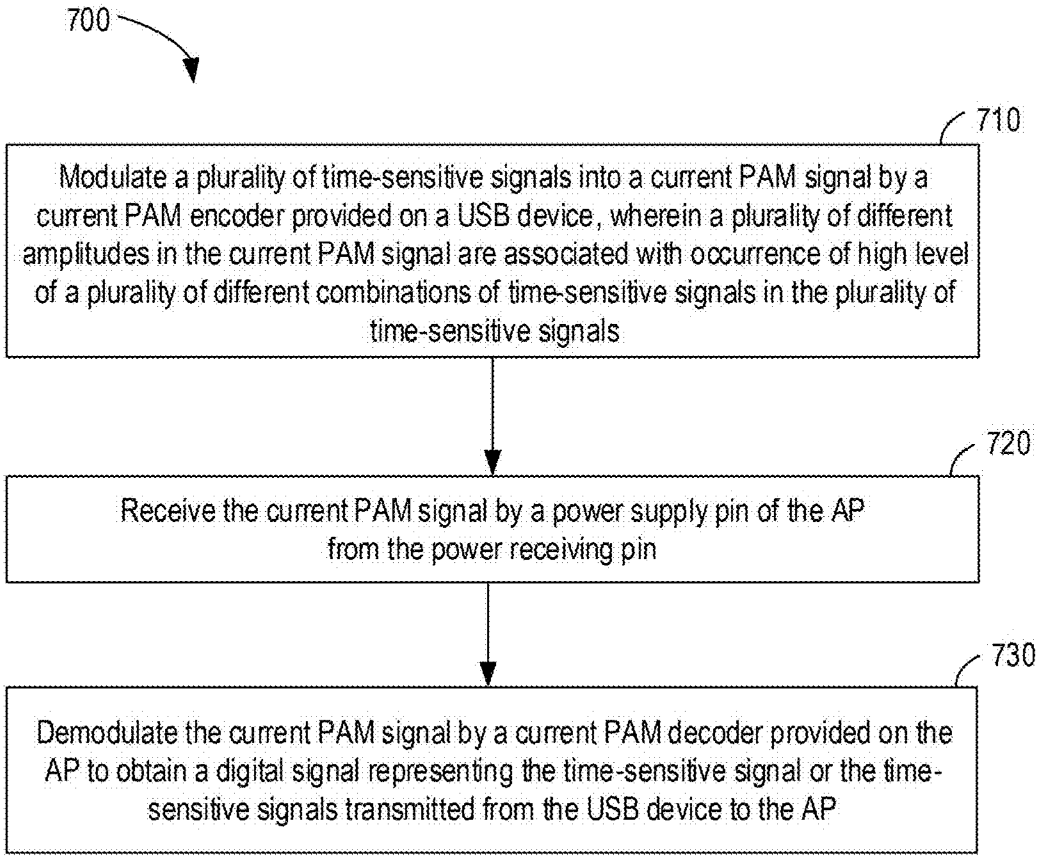
FIG. 7 illustrates a flow chart of a method for transmitting two or more time-sensitive signals from a USB device to an AP according to some implementations of the present disclosure.

Reference is made to FIG. 7, which illustrates a flow chart of a method 700 for transmitting two or more time-sensitive signals from a USB device to an AP according to some implementations of the present disclosure. As shown in FIG. 7, at block 710, the current PAM encoder (for example, the current PAM encoder 201 on the USB device as shown in FIG. 2) modulates a plurality of time-sensitive signals into a current PAM signal, and a plurality of different amplitudes in the current PAM signal is associated with occurrence of high level of a plurality of different combinations of time-sensitive signals in the plurality of time-sensitive signals. For example, in some implementations, the plurality of TSSs includes two different TSSs, and the modulated current PAM signal includes three current peaks or three different amplitudes.

At block 720, the current PAM signal is received by a power supply pin of the AP from the power receiving pin. At block 730, the current PAM signal is demodulated by a current PAM decoder provided on the AP to obtain a digital signal representing one or more time-sensitive signals transmitted from the USB device to the AP. In this method, by modulating multiple time-sensitive signals into a same current PAM signal by an encoder on the USB device and demodulating the current PAM signal by a decoder on the AP, multiple time-sensitive signals transmitted from the USB device to the AP may be demodulated to be for example, digital signals, thereby enabling simultaneous transmission of multiple time-sensitive signals from the USB device to the AP, and the type and number of transmitted TSSs may be represented by a digital output from the decoder.

In the context of this disclosure, while operations are depicted in a particular order, this should not be understood as requiring that such operations be performed in the particular order shown or in sequential order or that all illustrated operations be performed to achieve desirable results. In certain circumstances, multitasking and parallel processing may be advantageous. Certain features that are described in the context of separate implementations may also be implemented in combination in a single implementation. Conversely, various features that are described in the context of a single implementation may also be implemented in multiple implementations separately or in any suitable subcombination.

In the foregoing Detailed Description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

What is claimed is:

1. A system, comprising:

an Access Point (AP) comprising a power supply pin; and a Universal Serial Bus (USB) device operating at the same frequency as the AP and comprising a power receiving pin and a current pulse amplitude modulation (PAM) encoder, wherein the current PAM encoder is configured to modulate a plurality of time-sensitive signals into a current PAM signal, and a plurality of different amplitudes in the current PAM signal is associated with occurrence of high level of a plurality of different combinations of time-sensitive signals in the plurality of time-sensitive signals, wherein the AP further comprises a current PAM decoder configured to receive the current PAM signal via the power supply pin from the power receiving pin and demodulate the current PAM signal to obtain a digital signal representing one or more of the plurality of time-sensitive signals transmitted from the USB device to the AP.

2. The system according to claim 1, wherein the AP further comprises a power source connected to the power supply pin and the power receiving pin to provide power to the USB device.

3. The system according to claim 2, wherein the plurality of time-sensitive signals comprises a first number of time-sensitive signals, the current PAM encoder comprises a number of branches, wherein the number of branches is coupled between the power source and a ground potential, and respectively controlled by the first number of time-sensitive signals, such that a respective current flows through a respective branch upon occurrence of high level of a time-sensitive signal for controlling the respective branch; and the currents flowing through the number of branches are different from each other.

4. The system according to claim 3, wherein the plurality of time-sensitive signals comprises a pulse per second (PPS) and a channel coexistence signal (CCS), the number of branches comprises:

a first branch controlled by the CCS such that in response to high level of the CCS, the first branch is turned on so that a first current flows through it; and a second branch controlled by the PPS such that in response to high level of the PPS, the second branch is turned on so that a second current flows through it, and the first current is different from the second current.

5. The system according to claim 4, wherein:

the first branch comprises a first switch controlled to be turned on upon occurrence of the high level of the CCS, wherein the first switch is connected in series between the power receiving pin and a first resistor connected to ground;

the second branch comprises a second switch controlled to be turned on upon occurrence of the high level of the PPS, wherein the second switch is connected in series between the power receiving pin and a second resistor connected to ground; and resistance values of the first resistor and the second resistor are different.

6. The system according to claim 3, wherein the current PAM decoder comprises:

a sampling resistor coupled in series between the power source and the current PAM encoder and configured to sample the current flowing through the current PAM encoder to form a sampling voltage; and a determination module configured to determine type and number of time-sensitive signals at high level among the first number of time-sensitive signals based on the sampling voltage.

7. The system according to claim 6, wherein the sampling resistor is connected in series between the power source and the power supply pin.

8. The system according to claim 6, wherein the current PAM decoder further comprises:

an amplifier configured to amplify the sampling voltage to form an amplified voltage; and wherein the determination module comprises:

a plurality of comparators, each of which is configured to receive the amplified voltage at a first input terminal and a corresponding reference voltage at a second input terminal to compare the amplified voltage with the reference voltage.

9. The system according to claim 8, wherein:

a first number of time-sensitive signal (TSS) comprises a pulse per second (PPS) and a channel coexistence signal (CCS), and in the case that the CCS and the PPS are both at a low level, current consumption on the USB device is within a first range;

in the case that the CCS is at a high level, the current consumption on the USB device is within a second range;

in the case that the PPS is at a high level, the current consumption on the USB device is within a third range;

in the case that the CCS and the PPS are both at a high level, the current consumption on the USB device is within a fourth range;

the plurality of comparators comprises a first comparator, a second comparator, and a third comparator, wherein the reference voltage of the first comparator is between a maximum value of the first range and a minimum value of the second range;

the reference voltage of the second comparator is between a maximum value of the second range and a minimum value of the third range; and the reference voltage of the third comparator is between a maximum value of the third range and a minimum value of the fourth range.

10. A circuitry, comprising:

a first circuit comprising a power supply pin; and a second circuit comprising a power receiving pin and a current pulse amplitude modulation (PAM) encoder, wherein the current PAM encoder is configured to modulate a plurality of time-sensitive signals into a current PAM signal, and a plurality of different amplitudes in the current PAM signal is associated with occurrence of high level of a plurality of different combinations of time-sensitive signals in the plurality of time-sensitive signals;

wherein the first circuit further comprises a current PAM decoder configured to receive the current PAM signal via the power supply pin from the power receiving pin and demodulate the current PAM signal to obtain a digital signal representing one or more of the plurality of time-sensitive signals transmitted from the second circuit to the first circuit.

11. The circuitry according to claim 10, wherein the first circuit further comprises a power source connected to the power supply pin and to the power receiving pin to provide power to the second circuit.

12. The circuitry according to claim 11, wherein the plurality of time-sensitive signals comprises a first number of time-sensitive signals, the current PAM encoder comprises a number of branches, wherein the number of branches is coupled between the power source and a ground potential, and respectively controlled by the first number of time-sensitive signals, such that a respective current flows through a respective branch upon occurrence of high level of a time-sensitive signal for controlling the respective branch; and the currents flowing through the number of branches are different from each other.

13. The circuitry according to claim 12, wherein the plurality of time-sensitive signals comprises a pulse per second (PPS) and a channel coexistence signal (CCS), the number of branches comprises:

a first branch controlled by the CCS such that in response to high level of the CCS, the first branch is turned on so that a first current flows through it; and a second branch controlled by the PPS such that in response to high level of the PPS, the second branch is turned on so that a second current flows through it, and the first current is different from the second current.

14. The circuitry according to claim 13, wherein:

the first branch comprises a first switch controlled to be turned on upon occurrence of the high level of the CCS, wherein the first switch is connected in series between the power receiving pin and a first resistor connected to ground;

the second branch comprises a second switch controlled to be turned on upon occurrence of the high level of the PPS, wherein the second switch is connected in series between the power receiving pin and a second resistor connected to ground; and resistance values of the first resistor and the second resistor are different.

15. The circuitry according to claim 12, wherein the current PAM decoder comprises:

a sampling resistor coupled in series between the power source and the current PAM encoder and configured to sample the current flowing through the current PAM encoder to form a sampling voltage; and a determination module configured to determine type and number of time-sensitive signals at high level among the first number of time-sensitive signals based on the sampling voltage.

16. The circuitry according to claim 15, wherein the sampling resistor is connected in series between the power source and the power supply pin.

17. The circuitry according to claim 15, wherein the current PAM decoder further comprises:

an amplifier configured to amplify the sampling voltage to form an amplified voltage; and wherein the determination module comprises:

a plurality of comparators, each of which is configured to receive the amplified voltage at a first input terminal and a corresponding reference voltage at a second input terminal to compare the amplified voltage with the reference voltage.

18. A method, comprising:

modulating a plurality of time-sensitive signals into a current pulse amplitude modulation (PAM) signal by a current PAM encoder provided on a Universal Serial Bus (USB) device, wherein a plurality of different amplitudes in the current PAM signal is associated with occurrence of high level of a plurality of different combinations of time-sensitive signals in the plurality of time-sensitive signals, and the USB device further comprises a power receiving pin and operates at the same frequency as an access point (AP);

receiving the current PAM signal via a power supply pin of the AP from the power receiving pin; and demodulating the current PAM signal by a current PAM decoder provided on the AP to obtain a digital signal representing one or more of the plurality of time-sensitive signals transmitted from the USB device to the AP.

* * * * *